(12) United States Patent
Togami et al.

(10) Patent No.: US 7,978,974 B2
(45) Date of Patent: Jul. 12, 2011

(54) INSERTABLE EMI SHIELD CLIP FOR USE IN OPTICAL TRANSCEIVER MODULES

(75) Inventors: Chris K. Togami, San Jose, CA (US); Ramesh Sundaram, Fremont, CA (US); Hermando Esguerra, San Jose, CA (US)

(73) Assignee: Finisar Corporation, Sunnyvale, CA (US)

( * ) Notice: Subject to any disclaimer, the term of this patent is extended or adjusted under 35 U.S.C. 154(b) by 892 days.

(21) Appl. No.: 11/860,195

(22) Filed: Sep. 24, 2007

(65) Prior Publication Data
US 2009/0028557 A1    Jan. 29, 2009

Related U.S. Application Data

(60) Provisional application No. 60/827,366, filed on Sep. 28, 2006.

(51) Int. Cl.
*H04K 3/00* (2006.01)
(52) U.S. Cl. .......................... 398/39; 398/138; 398/164
(58) Field of Classification Search .................. 398/39, 398/117, 135–138, 141, 164
See application file for complete search history.

(56) References Cited

U.S. PATENT DOCUMENTS

| 2002/0110336 | A1* | 8/2002 | Dair et al. ................... 385/92 |
| 2003/0236019 | A1* | 12/2003 | Hanley et al. ............... 439/372 |
| 2007/0167077 | A1* | 7/2007 | Mizue ......................... 439/607 |
| 2007/0224884 | A1* | 9/2007 | Engel et al. ................. 439/607 |
| 2007/0230878 | A1* | 10/2007 | Nakazawa et al. ........... 385/92 |
| 2007/0280606 | A1* | 12/2007 | Nelson et al. ................ 385/92 |

FOREIGN PATENT DOCUMENTS

| CN | 200780042620.X | 6/2010 |
| WO | PCT/US2007/079972 | 9/2008 |

\* cited by examiner

*Primary Examiner* — Dzung D Tran
(74) *Attorney, Agent, or Firm* — Maschoff Gilmore & Israelsen

(57) ABSTRACT

The embodiments disclosed herein relate an insertable shield clip for use in controlling electromagnetic interference in an optical transceiver module. The optical transceiver module may include a shell that houses first and second optical subassemblies and an enclosure that cooperates with the shell in defining a covering for the optical transceiver module. The shield clip may comprise a body composed of conductive material. The body may include first and second vertical side members. The body may also include first and second shield members that are each configured to receive a corresponding nosepiece of one of the first and second optical subassemblies. The body may further include a bottom member that interconnects the first and second vertical side members and the first and second shield members.

21 Claims, 9 Drawing Sheets

INSERTABLE EMI SHIELD CLIP FOR USE IN OPTICAL TRANSCEIVER MODULES

CROSS-REFERENCE TO RELATED APPLICATIONS

This application claims the benefit of U.S. Provisional Application No. 60/827,366, filed Sep. 28, 2006, which is incorporated herein by reference in its entirety.

BACKGROUND

1. Technology Field

The present invention generally relates to communications modules, such as optical transceiver modules. In particular, embodiments of the present invention relate to an insertable shield for use in optical transceiver modules to reduce the emission of electromagnetic interference therefrom, especially in regions where a shell and enclosure of the transceiver engage one another.

2. The Related Technology

Computing and networking technology have transformed our world. As the amount of information communicated over networks has increased, high speed transmission has become ever more critical. Many high speed data transmission networks rely on optical transceivers and similar devices for facilitating transmission and reception of digital data embodied in the form of optical signals over optical fibers. Optical networks are thus found in a wide variety of high speed applications ranging from modest Local Area Networks ("LANs") to backbones that define a large portion of the infrastructure of the Internet.

Typically, data transmission in such networks is implemented by way of an optical transmitter (also referred to as an "optoelectronic transducer"), such as a laser or Light Emitting Diode ("LED"). The optoelectronic transducer emits light when current is passed through it, the intensity of the emitted light being a function of the magnitude of the current. Data reception is generally implemented by way of an optical receiver (also referred to as an optoelectronic transducer), an example of which is a photodiode. The optoelectronic transducer receives light and generates a current, the magnitude of the generated current being a function of the intensity of the received light.

Various other components are also employed by the optical transceiver to aid in the control of the optical transmit and receive components, as well as the processing of various data and other signals. For example, the optical transmitter is typically housed in a transmitter optical subassembly ("TOSA"), while the optical receiver is housed in a separate receiver optical subassembly ("ROSA"). The transceiver also typically includes a driver (e.g., referred to as a "laser driver" when used to drive a laser signal) configured to control the operation of the optical transmitter in response to various control inputs and an amplifier (e.g., often referred to as a "post-amplifier") configured to amplify the channel-attenuated received signal prior to further processing. A controller circuit (hereinafter referred to as the "controller") controls the operation of the laser driver and post-amplifier.

As optical transmission speed provided by transceivers and other communications modules rises, traditionally insignificant operational hindrances become more pronounced. One hindrance that is increasingly encountered as transmission speeds increase involves electromagnetic interference, or "EMI." EMI is electrical noise produced by components of the transceiver module that is manifested in the form of electromagnetic waves that are emitted from the transceiver.

Optical transceiver packages, especially those operating at high transmission speeds, are especially susceptible to the emission of EMI. This phenomenon is undesirable because EMI can interfere with the proper operation of other electrical components. In particular, the physical configuration of existing transceiver modules does a poor job of containing EMI— especially as the generating speed of the module increases. Some areas of the optical transceiver module are more susceptible than others in emitting undesired EMI. Examples of such areas include joints between the external enclosure an exposed portions of the transceiver shell.

Therefore, there is a need in the industry for a pluggable module, such as an optoelectronic transceiver module, that is configured so as to minimize the emission of EMI. Preferably, the module configuration could be used in environments having high frequency data signal transmissions. Moreover, the module configuration should include means by which specified areas traditionally susceptible to EMI emission are sufficiently shielded to prevent such emission.

BRIEF SUMMARY

The embodiments disclosed herein relate an insertable shield clip for use in controlling electromagnetic interference in an optical transceiver module. The optical transceiver module may include a shell that houses first and second optical subassemblies and an enclosure that cooperates with the shell in defining a covering for the optical transceiver module.

The shield clip may comprise a body composed of conductive material. The body may include first and second vertical side members. The side members include a first plurality of spring fingers that are configured to compressively engage between the shell and enclosure.

The body may also include first and second shield members that are each configured to receive a corresponding nosepiece of one of the first and second optical subassemblies. The first and second shield members are positioned proximate a flange of the corresponding nosepiece so as to intercept electromagnetic interference produced by the optical transceiver module.

The body may further include a bottom member that includes a second plurality of spring fingers configured to compressively engage between the shell and the enclosure. The bottom member interconnects the first and second vertical side members and the first and second shield members.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by the practice of the teaching herein. The features and advantages of the teaching herein may be realized and obtained by means of the instruments and combinations particularly pointed out in the appended claims. These and other features will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof that are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION

The embodiments disclosed herein relate an insertable shield clip for use in controlling electromagnetic interference in an optical transceiver module. The optical transceiver module may include a shell that houses first and second optical subassemblies and an enclosure that cooperates with the shell in defining a covering for the optical transceiver module.

The shield clip may comprise a body composed of conductive material. The body may include first and second vertical side members. The side members include a first plurality of spring fingers that are configured to compressively engage between the shell and enclosure.

The body may also include first and second shield members that are each configured to receive a corresponding nosepiece of one of the first and second optical subassemblies. The first and second shield members are positioned proximate a flange of the corresponding nosepiece so as to intercept electromagnetic interference produced by the optical transceiver module.

The body may further include a bottom member that includes a second plurality of spring fingers configured to compressively engage between the shell and the enclosure. The bottom member interconnects the first and second vertical side members and the first and second shield members.

Reference will now be made to figures wherein like strictures will be provided with like reference designations. It is understood that the drawings are diagrammatic and schematic representations of exemplary embodiments of the invention, and are not limiting of the present invention nor are they necessarily drawn to scale.

FIGS. 1-8 depict various features of embodiments of the present invention, which are generally directed to an apparatus for inclusion in a communications module, such as an optical transceiver module, that is configured to reduce or eliminate the emission of EMI from specified portions of the module. In particular, the apparatus is configured as an EMI shield clip to prevent EMI emissions from side and front portions of an optical transceiver module, thereby improving overall EMI performance.

Figure 1:
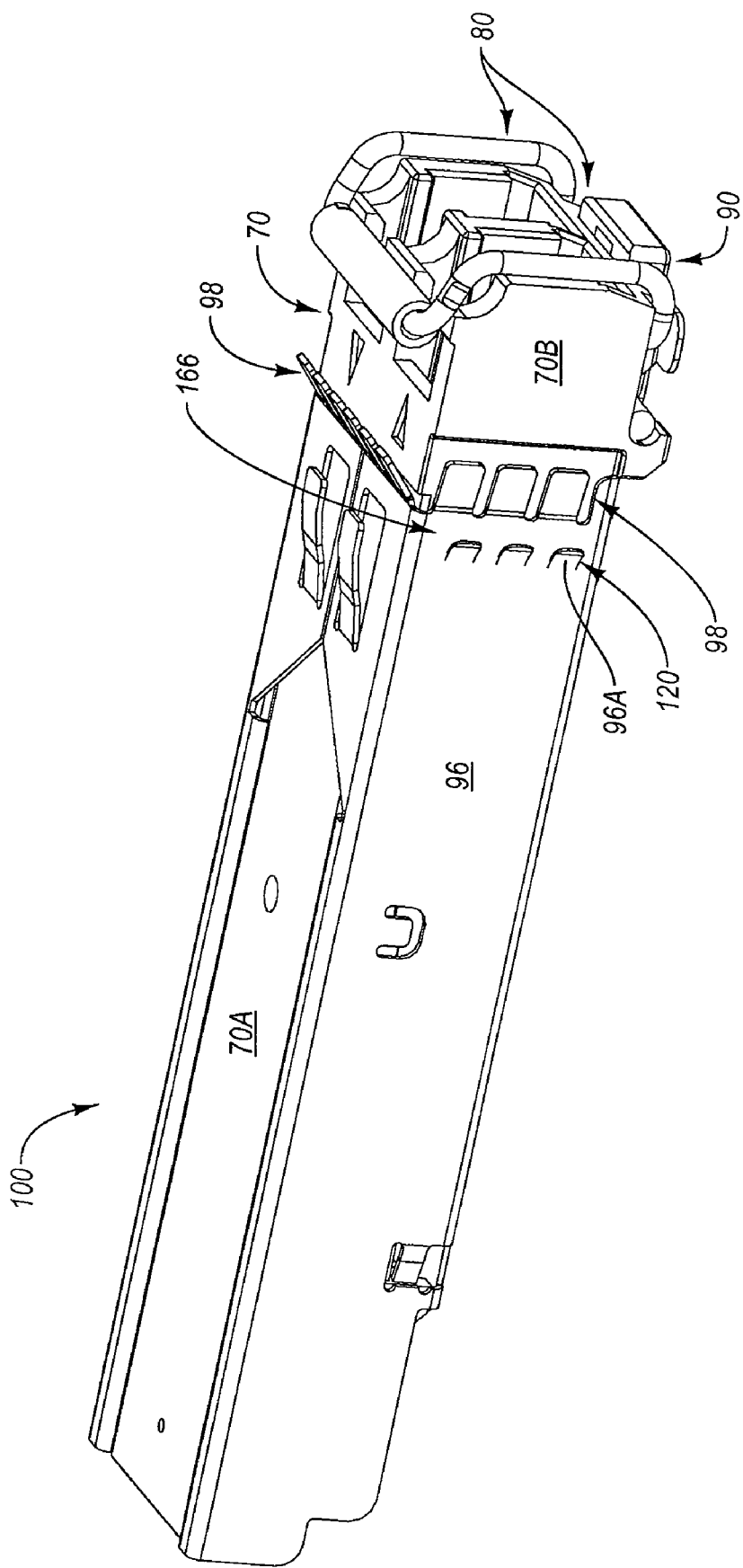
FIG. 1 is a perspective view of an optical transceiver module that serves as one exemplary environment where embodiments of the present invention can be practiced.
Figure 2:
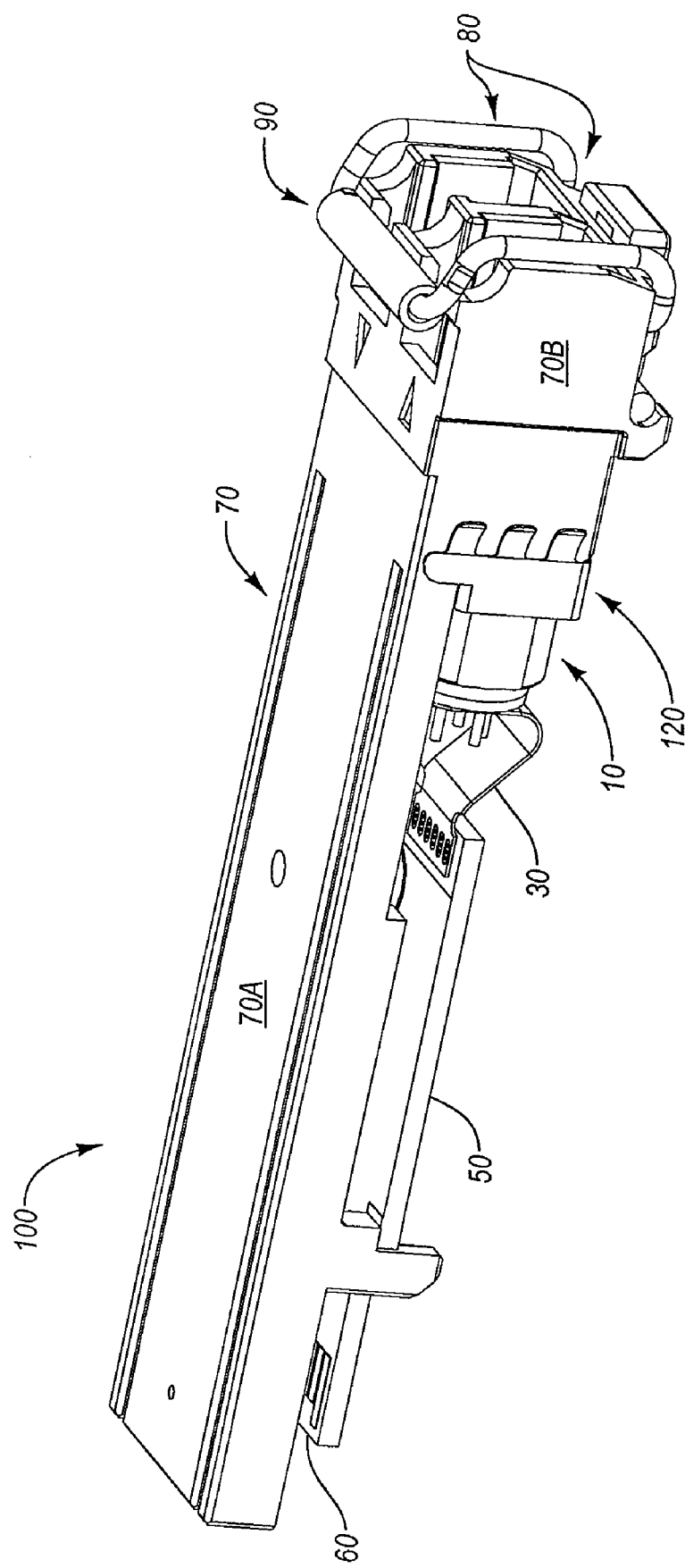
FIG. 2 is a perspective view of the transceiver module of FIG. 1, with the enclosure removed, showing an EMI shield clip configured in accordance with one embodiment.

Reference is first made to FIGS. 1 and 2 in describing an exemplary environment in which the EMI shield clip of embodiments of the present invention can be practiced. In detail, FIG. 1 depicts a perspective view of an optical transceiver module ("transceiver"), generally designated at 100, for use in transmitting and receiving optical signals in connection with an external host that is operably connected in one embodiment to a communications network (not shown). As depicted, the transceiver of FIGS. 1 and 2 includes various components, including a transmitter optical subassembly ("TOSA") 10, a receiver optical subassembly ("ROSA") 20 (shown in FIG. 6), flexible circuits 30, and a printed circuit board 50. In detail, two flexible circuits 30, only one of which is seen in FIG. 6, are included in the transceiver 100, one each used to electrically connect the TOSA 10 and the ROSA 20 to a plurality of conductive pads located on the PCB 50. An edge connector 60 (FIGS. 2, 5) is located on an end of the PCB 50 to enable the transceiver 100 to electrically interface with a host device (not shown). As such, the PCB 50 facilitates electrical communication between the TOSA 10/ROSA 20, and the host.

The above-mentioned components of the transceiver 100 are partially housed within a shell 70 that includes an elongate body portion 70A and a front end portion 70B. A pair of ports 80 is included in the shell front end portion 70B and are configured for receiving connectorized optical fiber cables (not shown) therein so as to permit the reception and transmission of optical signals by the transceiver 100. A latch mechanism 90 is also included for removably securing the transceiver 100 within a slot of the host device.

An enclosure 96 is included for slidably engaging the transceiver shell 70 so as to form, with the shell, a covering for the internal transceiver components. An end portion of the enclosure 96 proximate the front end portion 70B of the shell 70 includes a plurality of spring fingers 98 that are configured to electrically connect with corresponding portions of the host device slot in which the transceiver is received, thereby electrically grounding the shell 70 and enclosure 96 commonly with respect to the host device.

As mentioned, embodiments of the present invention are directed to an apparatus for reducing or preventing EMI emission from selected regions of a communications module. The transceiver 100 shown in FIGS. 1 and 2 is one example of such a communications module. Note that, while the transceiver 100 is described in some detail herein, the optical transceiver 100 is described by way of illustration only, and not by way of restricting the scope of the invention. For example, the optical transceiver 100 in one embodiment can be suitable for optical signal transmission and reception at a variety of per-second data rates, including but not limited to 1 Gbit, 2 Gbit, 4 Gbit, 8 Gbit, 10 Gbit, or higher bandwidth fiber optic links. Also, the principles of the present invention can be implemented in optical transceivers of any form factor such as XFP, SFP and SFF, without restriction. Furthermore, communications modules of other types and configurations, or having components that differ in some respects from those shown and described herein, can also benefit from the principles disclosed herein.

During operation, the transceiver 100 can receive a data-carrying electrical signal from the host, which can be any computing system capable of communicating with the optical transceiver 100, for transmission as a data-carrying optical signal on to an optical fiber (not shown). The electrical differential data signal is provided to a light source, such as a laser located in the TOSA 10, which converts the electrical signal into a data-carrying optical signal for emission on to an optical fiber and transmission via an optical communications network, for instance. The laser (not shown) can be an edge-emitting laser diode, a vertical cavity surface emitting laser ("VCSEL"), a distributed feedback ("DFB") laser, or other suitable light source. Accordingly, the TOSA 10 serves as an electro-optic transducer.

In addition, the transceiver 100 is configured to receive a data-carrying optical signal from an optical fiber via the ROSA 20. The ROSA 20 acts as an opto-electric transducer by transforming the received optical signal, via a photodetector or other suitable device included in the ROSA, into an electrical signal. The resulting electrical signal is then provided to the host device in which the transceiver 100 is received.

As seen in FIG. 2, the transceiver 100 further includes a device that is useful for reducing the emission of electromagnetic interference ("EMI") from selected portions of the transceiver 100. In particular, an EMI shield clip, generally designated at 120, is shown positioned proximate a corresponding segment of the transceiver shell 70. So positioned, the shield clip 120 is useful for enhancing the EMI containment aspects of the transceiver 100, as will be explained.

Figure 3:
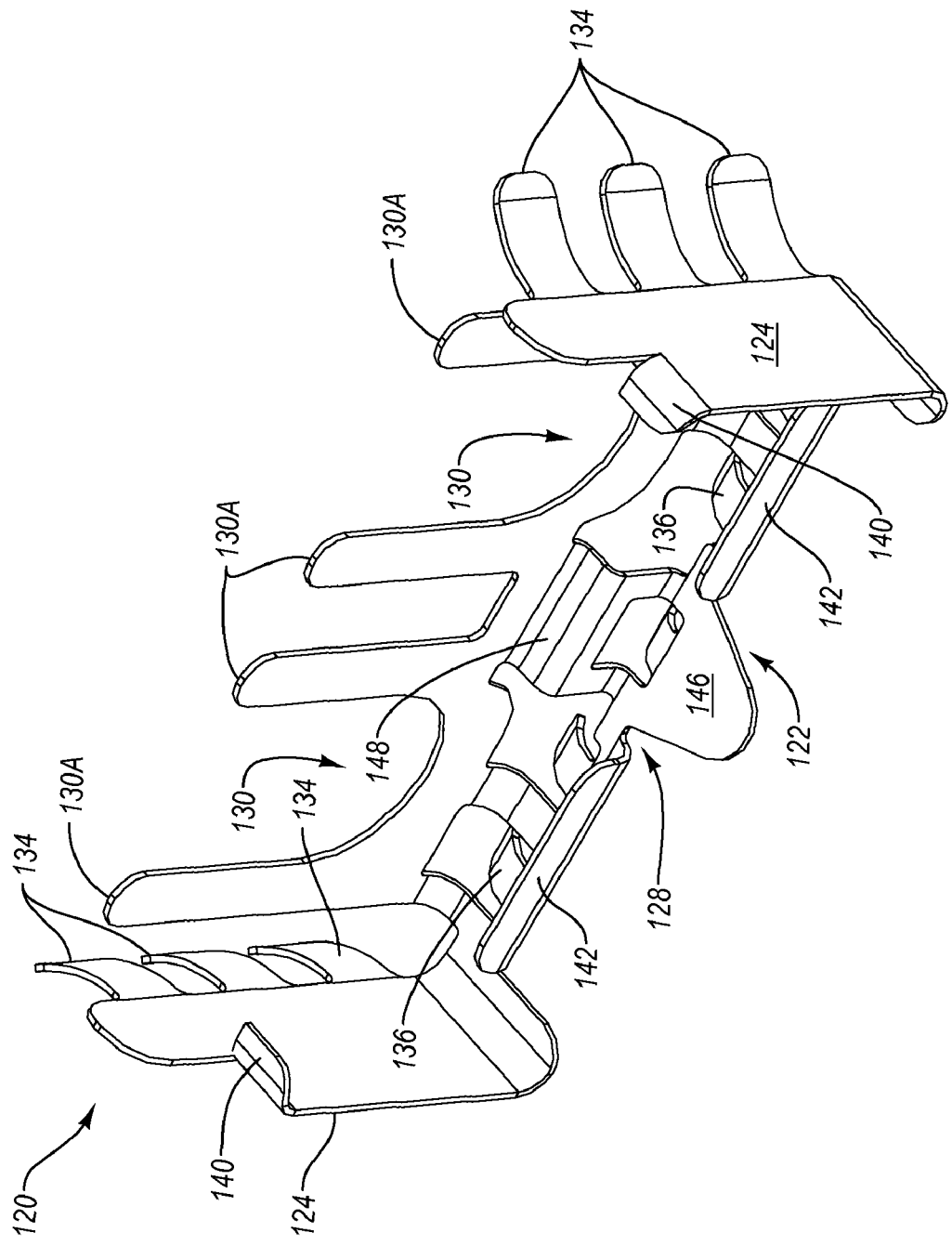
FIG. 3 is a perspective view of an EMI shield clip according to one embodiment.
Figure 4:
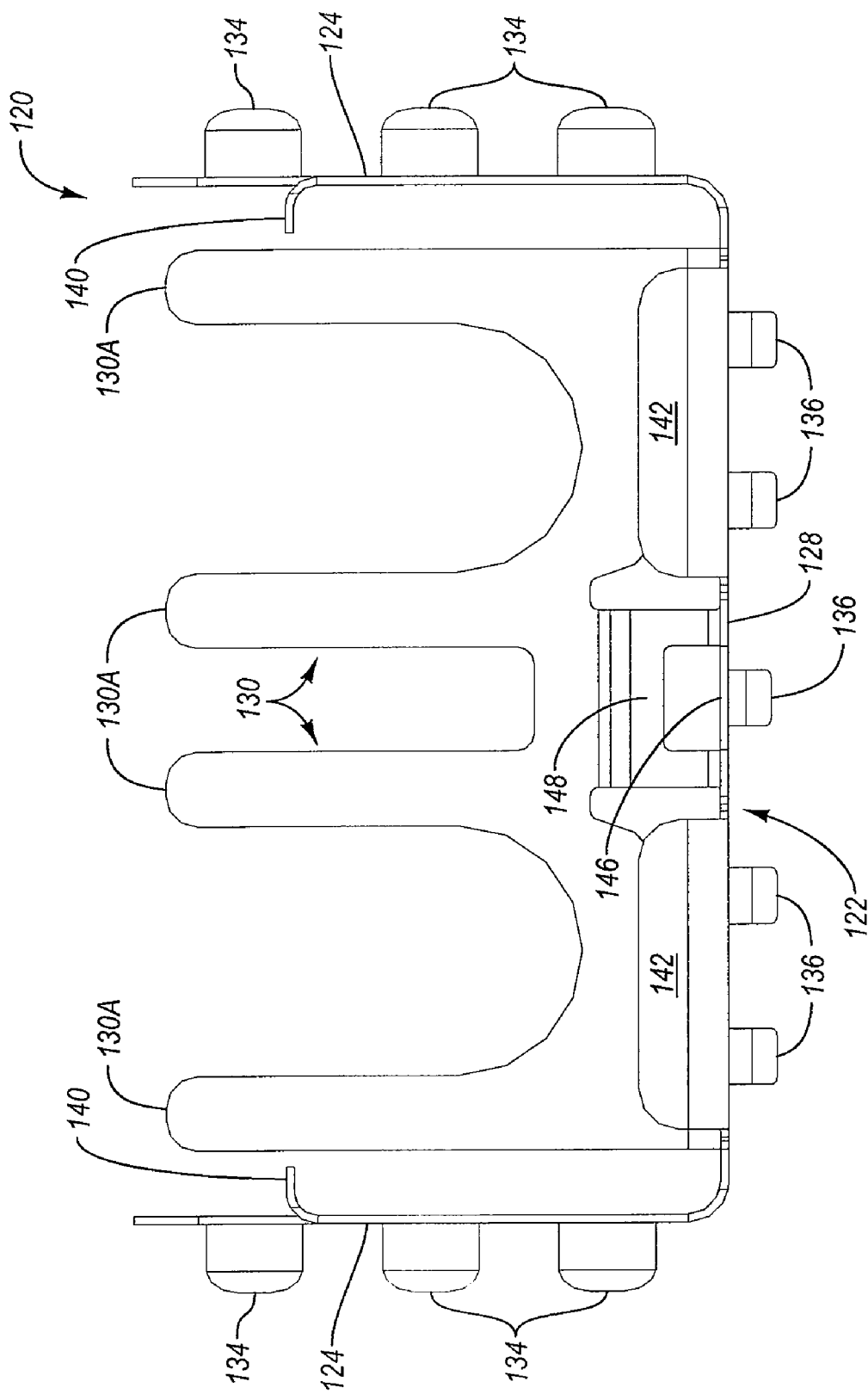
FIG. 4 is an end view of the EMI shield clip of FIG. 3.

Reference is now made to FIGS. 3 and 4 in describing various details regarding one embodiment of the shield clip 120. As shown, the shield clip 120 includes a body 122 composed of two vertical side members 124 that are interconnected via a bottom member 128. Two shield members 130 are also included as part of the shield body 122. The shield members 130 are each attached to the bottom member 128 and interconnected to one another via a connecting portion 148. Further details regarding each of these components are given below. The shield clip body 122 is composed in the present embodiment of a conductive material, such as a metallic substance, in order to enable its absorption of EMI.

In greater detail, an attached end of each side member 124 is connected to the bottom member 128 so as to extend vertically with respect to the horizontal bottom member, assuming an orientation as shown in FIG. 4. Each side member 124 includes a plurality of spring fingers 134 that are each curved outwardly away from the shield members 130. In the present embodiment, three spring fingers are included on each side member 124. Additionally, an inwardly extending side tab 140 is included near a top end of each side member 124. The side tab 140 can include a small "rollover" feature (not shown) thereon in order to facilitate mating with the shell 70 or other component of the transceiver 100 and to increase the mechanical strength of the shield clip 120 in this region.

Similar to the vertical side members 124, the bottom member 128 includes a plurality of outwardly curved spring fingers 136. In the illustrated embodiment, five spring fingers 136 are included on the bottom member 128. Also, two upwardly extending elongate bottom tabs 142 are included on the bottom member 128. Finally, a bottom extension 146 is included between both bottom tabs 142 and is connected to the connecting portion 148. The various components just described are useful in the purpose of the shield clip 120 in preventing or reducing EMI emission from the transceiver 100, as will be described. Note that the descriptive terms "inwardly," "outwardly," "vertical," "horizontal," and the like are used merely to facilitate a complete description of the shield clip to be made and are not meant to limit the present invention in any way.

Figure 5:
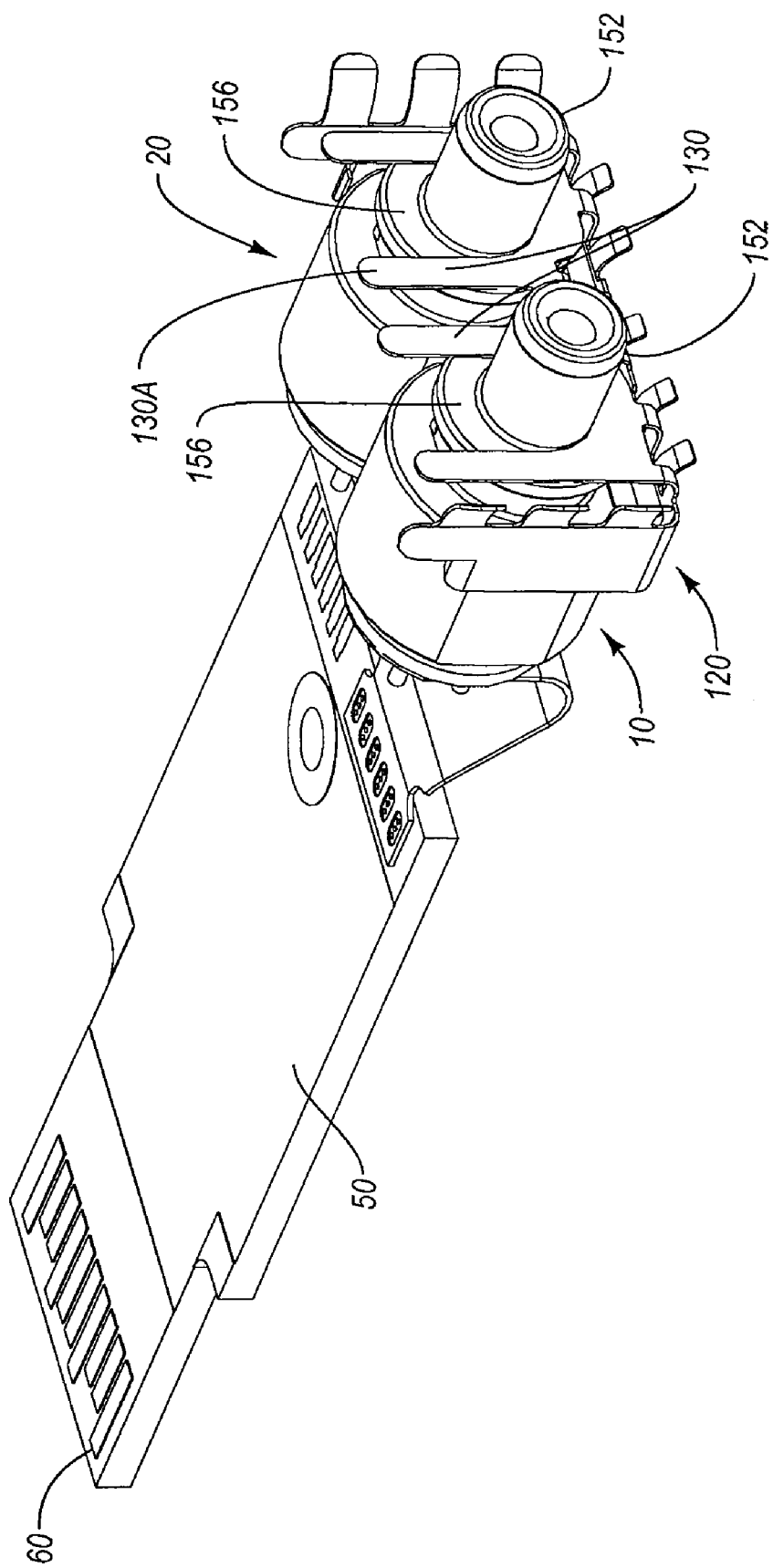
FIG. 5 is a perspective view of various internal components of the optical transceiver module of FIG. 1.
Figure 6:
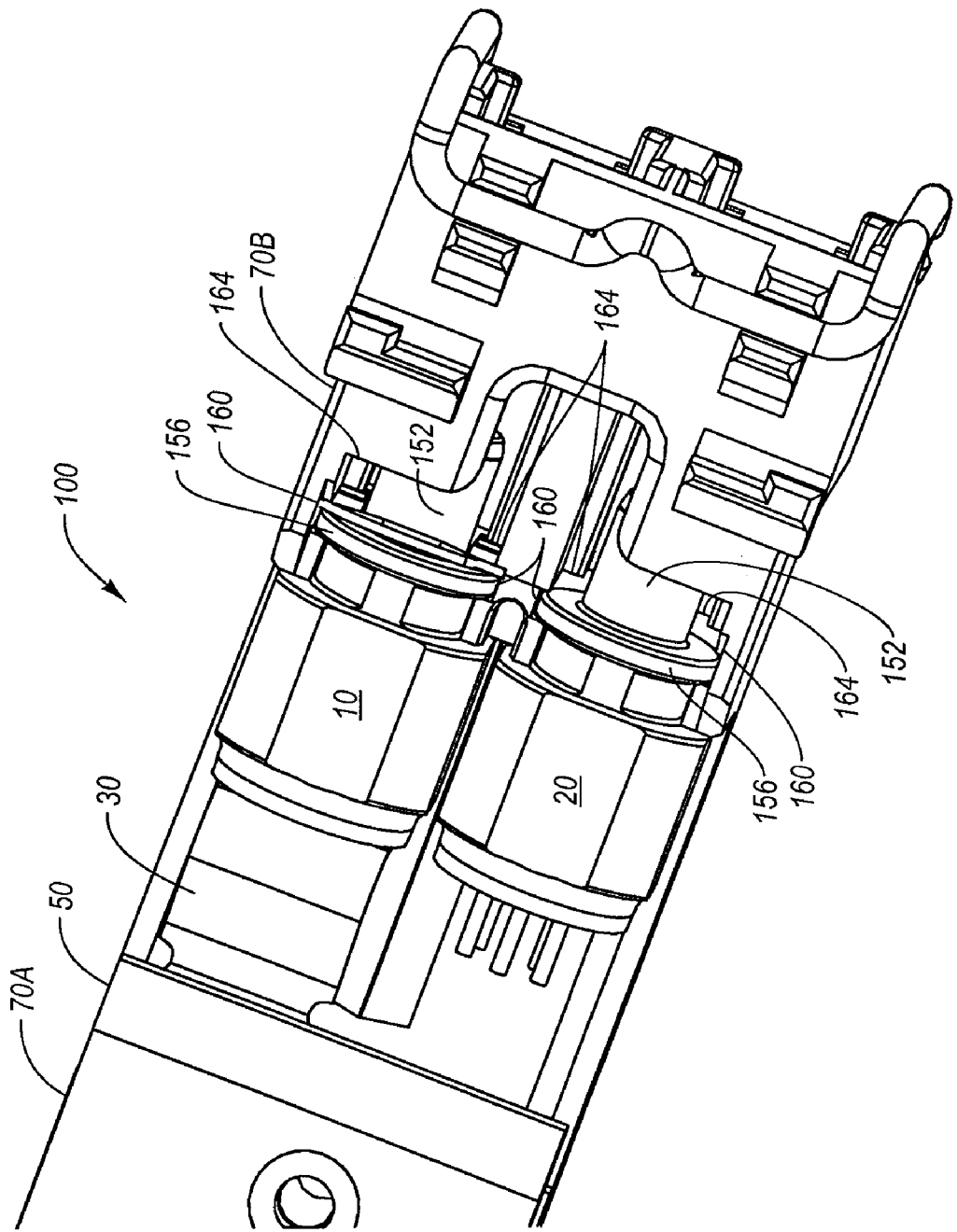
FIG. 6 is a perspective view of various internal components of the optical transceiver module of FIG. 1, without the EMI shield clip of FIG. 3 installed.

Reference is now made to FIG. 5, which depicts the manner in which the shield clip engages the TOSA 10 and ROSA 20 of the transceiver 100. As shown, both the TOSA 10 and the ROSA 20 include a nosepiece 152 extending from a flange 156. The shield clip shield members 130 each define U-shaped notches that are sized, spaced, and configured to receive a portion of the corresponding nosepiece 152 therein such that the nosepiece seats at the bottom curve of the notch. The shield clip 120 is laterally positioned such that each shield clip member resides adjacent the respective flange 156. So positioned, and being in electrical ground contact with other transceiver/host components to be described, each shield member 130 can intercept EMI emissions emanating toward the front of the transceiver for escape through and around the ports 80 defined in the shell front end portion 70B (FIG. 2). Instead of escaping, however, the EMI is desirably absorbed by the shield members 130, thereby preventing its emission.

Figure 7:
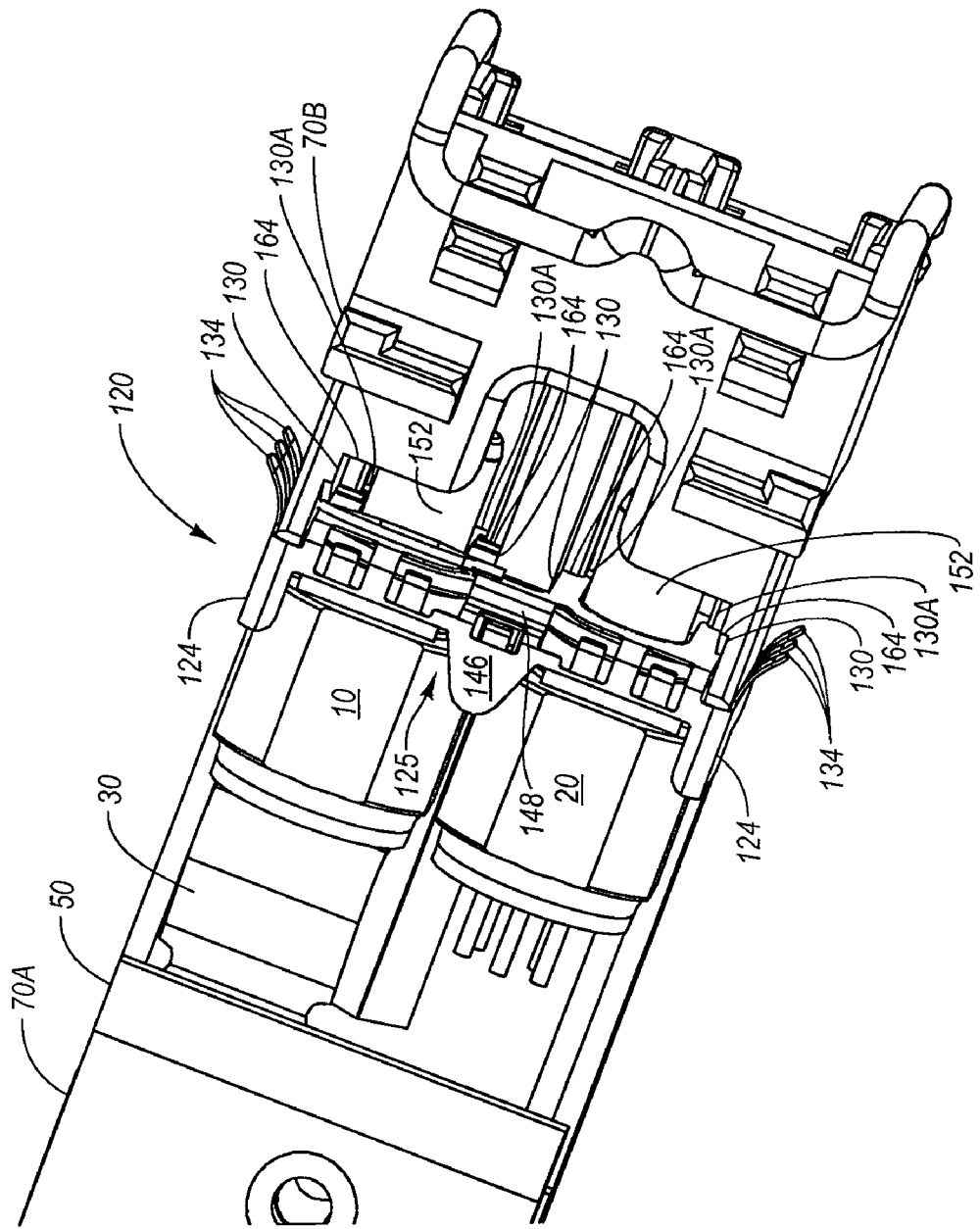
FIG. 7 is a perspective view of the internal components illustrated in FIG. 6, showing the EMI shield clip installed.

Reference is now made to FIGS. 6 and 7 in depicting various details regarding the placement of the shield clip 120 in the transceiver 100, in addition to that already discussed in connection with FIG. 5. As shown in FIG. 6, volumes are defined in the front end portion 70B of the shell 70 for receiving the TOSA 10 and ROSA 20. As further shown, the shell front end portion 70B defines flange slots 160 for receiving the flanges 156 of the TOSA and ROSA nosepieces 152, as depicted in FIG. 6. Additionally, a plurality of spaced-apart ridges 164 is defined by the shell front end portion 70B proximate the flange slots 160.

In FIG. 7, the shield clip 120 is shown inserted into the shell front end portion 70B such that the shield members 130 receive the nosepieces 152 in the manner also shown in FIG. 5. So positioned, the shield clip 120 is disposed adjacent a respective one of the TOSA/ROSA flanges 156 and tips 130A of each of the U-shaped shield members 130 are disposed adjacent the respective ridges 164, as shown in FIG. 7. This configuration partially secures the shield clip 120 within the shell.

In addition, the shield clip 120 is further secured in place by a "sandwiched" engagement between the shell 70 and the enclosure 96. As seen in FIG. 2, the shield clip 120 is placed in the transceiver 100 such that the side members 124 of the shield clip engage an outer portion of the shell 70B. Sliding engagement of the enclosure 96 onto the shell 70 is then performed such that the spring fingers 134 and 136 (both shown in an uncompressed state in FIG. 2) are compressed between the shell 70 and the enclosure 96, as shown in FIG. 1. So positioned, the enclosure 96 sandwiches the shield clip 120 between a portion of the shell 70 and the enclosure itself, thereby securing the shield clip in place.

This engagement between the shell 70, the enclosure 96, and the shield clip 120 further ensures that adequate electrical interconnectivity is achieved therebetween. In particular, the shell 70 and enclosure 96 are electrically grounded to the host or to some other grounding source through known mechanisms and methods not to be explicitly described herein. The engagement of the shield clip 120 with both the shell 70 and the enclosure 96 permits a common ground connection to be established with the shield clip as well. This enables the shield clip 120 to intercept EMI incident thereon before its emission outside of the transceiver 100.

The placement of the shield clip 120 in the transceiver 100 as best seen in FIG. 2 prevents emission of EMI from the transceiver in addition to that already described above in connection with the shield member 130. In detail, the side members 124 of the shield clip 120 are positioned between the shell 70 and the enclosure 96 proximate to the point at which the shell and enclosure overlap one another, generally depicted at 166 in FIG. 1. As this has traditionally been an area where undesired EMI emissions occur, use of the shield clip represents an advance in EMI emission prevention. Significantly, the present transceiver, which operates at a relatively high frequency and therefore generates relatively higher levels of EMI, is able to maintain a safe level of EMI emissions set by Industry guidelines via practice of embodiments of the present invention.

Figure 8:
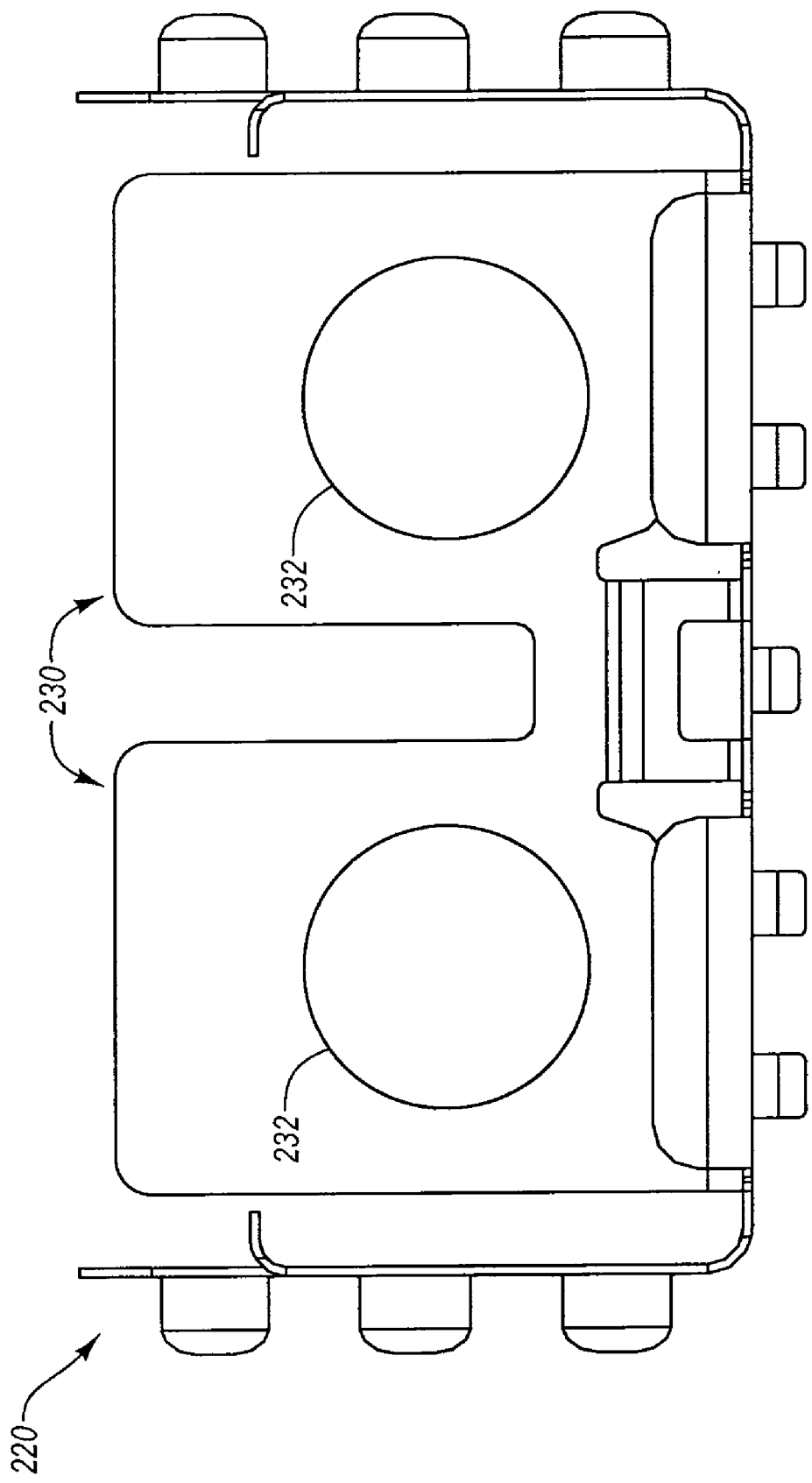
FIG. 8 is an end view of an EMI shield clip according to another exemplary embodiment.

Reference is now made to FIG. 8, which shows details of another embodiment of the present invention, wherein a shield clip 220 is shown. In contrast to the previous embodiment, the shield clip 220 includes shield members 230 that are substantially planar and solid, with the exception of holes 232 defined therein. The holes 232 are sized to receive the nosepieces 152 of the TOSA 10 and ROSA 20. The shield clip 220 is installed and used similarly to the shield clip 120 described above. However, the relatively larger size of the shield member 230 can result in even more EMI interruption, thereby enhancing the EMI characteristics of the transceiver 100.

Figure 9:
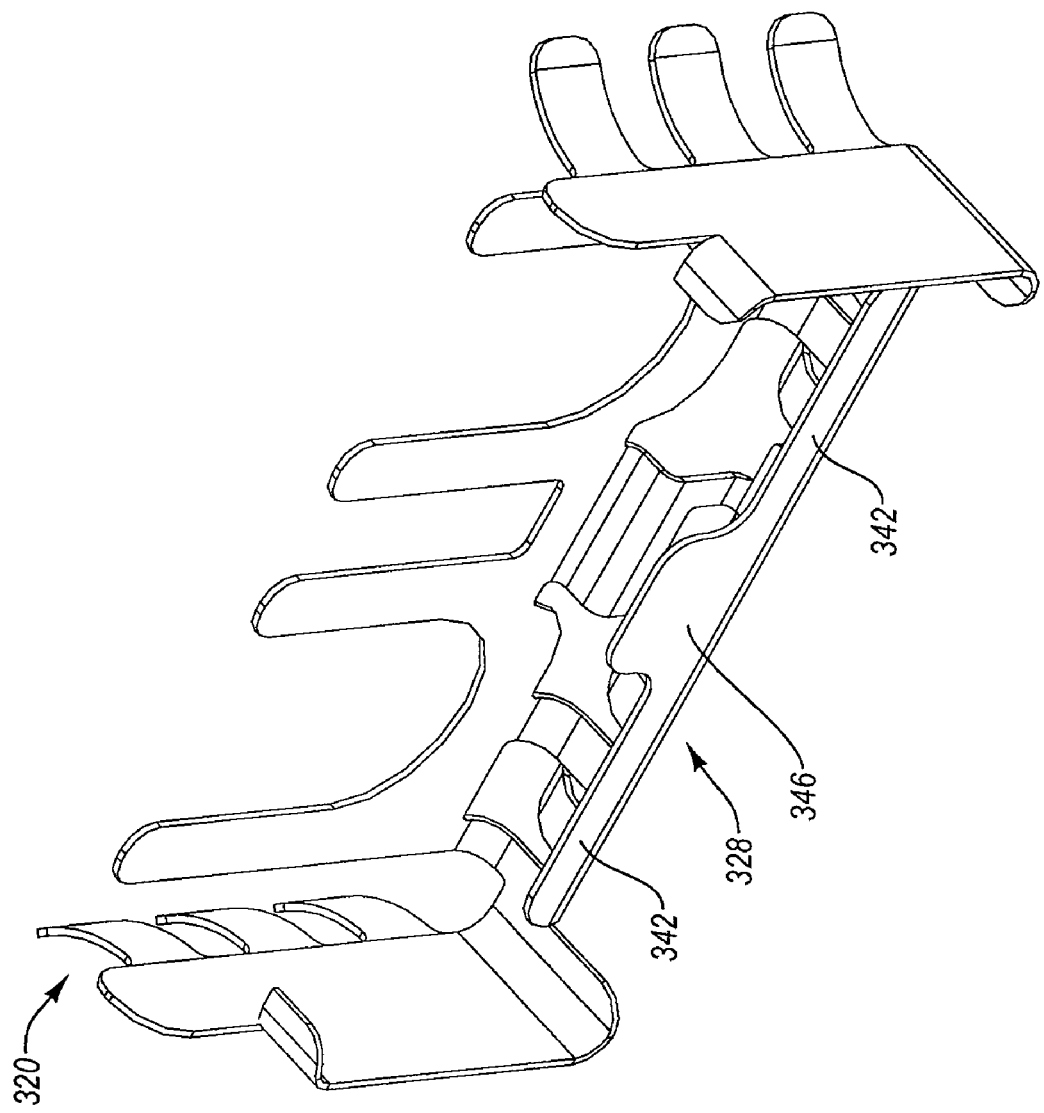
FIG. 9 is a perspective view of an EMI shield clip according to yet another exemplary embodiment.

Reference is now made to FIG. 9, which shows details of yet another embodiment of the present invention, wherein a shield clip 320 is shown. In contrast to the embodiment shown in FIG. 3, the shield clip 320 includes bottom tables 342 that are integrally formed with a bottom extension 346. In addition, the bottom extension 346 extends vertically from a bottom member 328. This configuration advantageously intercepts EMI so as to contain it before emission from the transceiver.

The present invention may be embodied in other specific forms without departing from its spirit or essential characteristics. The described embodiments are to be considered in all respects only as illustrative, not restrictive. The scope of the invention is, therefore, indicated by the appended claims rather than by the foregoing description. All changes that come within the meaning and range of equivalency of the claims are to be embraced within their scope.

What is claimed is:

1. An insertable shield clip for use in controlling electromagnetic interference in an optical transceiver module, the optical transceiver module including a shell that houses first and second optical subassemblies and an enclosure that cooperates with the shell in defining a covering for the optical transceiver module, the insertable shield clip comprising:
   a body composed of conductive material and including:
      first and second vertical side members, each side member including a first plurality of spring fingers that are configured to be compressed between the shell and the enclosure when the insertable shield clip is positioned within the optical transceiver module;
      first and second shield members that are each configured to receive a corresponding nosepiece of one of the first and second optical subassemblies, the first and second shield members being positioned proximate a flange of the corresponding nosepiece so as to intercept electromagnetic interference produced by the optical transceiver module; and
      a bottom member including a second plurality of spring fingers configured to be compressed between the shell and the enclosure when the insertable shield clip is positioned within the optical transceiver module, the bottom member interconnecting the first and second vertical side members and the first and second shield members.

2. The insertable shield clip in accordance with claim 1, wherein the insertable shield clip is secured in place between the enclosure and the shell when the enclosure is mated with the shell.

3. The insertable shield clip in accordance with claim 1, wherein the first plurality of spring fingers curve outward from the first and second vertical side members and wherein the second plurality of spring fingers curve outward from the bottom member.

4. The insertable shield clip in accordance with claim 1, wherein the first and second vertical side members further include an inwardly extending side tab positioned near the top portion of the first and second vertical side members, wherein the side tabs are configured to facilitate shield clip mating with the shell.

5. The insertable shield clip in accordance with claim 1, wherein the bottom member further includes two upwardly extending elongate bottom tabs.

6. The insertable shield clip in accordance with claim 5, wherein the bottom member further includes a bottom extension that extends horizontally from the bottom member and is positioned between the two upwardly extending elongate bottom tabs.

7. The insertable shield clip in accordance with claim 5, wherein the bottom member further includes a bottom extension that extends vertically from the bottom member and is integrally formed with the two upwardly extending elongate bottom tabs.

8. The insertable shield clip in accordance with claim 1, wherein the first and second shield members define U-shaped notches that are configured to receive the nosepiece of the first and second optical subassemblies.

9. The insertable shield clip in accordance with claim 1, wherein the first and second shield members define one or more holes that are configured to receive the nosepiece of the first and second optical subassemblies.

10. The insertable shield clip in accordance with claim 1, wherein when the insertable shield clip is installed in the optical transceiver module, the first and second vertical side members are positioned between the shell and the enclosure proximate the point at which the shell and the enclosure overlap one another.

11. An optical transceiver module comprising:
   a Transmit Optical Subassembly ("TOSA");
   a Receive Optical Subassembly ("ROSA");
   a shell that is configured to house the TOSA and the ROSA;
   an enclosure configured to cooperate with the shell in defining a covering of the optical transceiver module; and
   a shield clip configured to control electromagnetic interference in the optical transceiver module, the shield clip comprising:
      a body composed of conductive material and including:
         first and second vertical side members, each side member including a first plurality of spring fingers that are configured to be compressed between the shell and the enclosure when the shield clip is positioned within the optical transceiver module;
         first and second shield members that are each configured to receive a corresponding nosepiece of one of the TOSA and ROSA, the first and second shield members being positioned proximate a flange of the corresponding nosepiece so as to intercept electromagnetic interference produced by the optical transceiver module; and
         a bottom member including a second plurality of spring fingers configured to be compressed between the shell and the enclosure when the shield clip is positioned within the optical transceiver module, the bottom member interconnecting the first and second vertical side members and the first and second shield members.

12. The optical transceiver module in accordance with claim 11, wherein the shield clip is secured in place between the enclosure and the shell when the enclosure is mated with the shell.

13. The optical transceiver module in accordance with claim 11, the first plurality of spring fingers curve outward from the first and second vertical side members and wherein the second plurality of spring fingers curve outward from the bottom member.

14. The optical transceiver module in accordance with claim 11, wherein the first and second vertical side members further include an inwardly extending side tab positioned near the top portion of the first and second vertical side members, wherein the side tabs are configured to facilitate shield clip mating with the shell.

15. The optical transceiver module in accordance with claim 11, wherein the bottom member further includes two upwardly extending elongate bottom tabs.

16. The optical transceiver module in accordance with claim 15, wherein the bottom member further includes a bottom extension that extends horizontally from the bottom member and is positioned between the two upwardly extending elongate bottom tabs.

17. The optical transceiver module in accordance with claim 15, wherein the bottom member further includes a bottom extension that extends vertically from the bottom member and is integrally formed with the two upwardly extending elongate bottom tabs.

18. The optical transceiver module in accordance with claim 11, wherein the first and second shield members define U-shaped notches that are configured to receive the nosepiece of the ROSA and TOSA.

19. The optical transceiver module in accordance with claim 11, wherein the first and second shield members define one or more holes that are configured to receive the nosepiece of the ROSA and TOSA.

20. The optical transceiver module in accordance with claim 11, wherein the first and second vertical side members are positioned between the shell and the enclosure proximate the point at which the shell and the enclosure overlap one another.

21. The optical transceiver module in accordance with claim 11, wherein the optical transceiver module is one of an XFP module, an SFP module, and an SFF module.

* * * * *